US007057542B2

(12) United States Patent
Yeh et al.
(10) Patent No.: US 7,057,542 B2
(45) Date of Patent: Jun. 6, 2006

(54) DATA DRIVING CIRCUIT, ORGANIC LIGHT EMITTING DIODE DISPLAY UTILIZING THE SAME, AND DRIVING METHOD THEREFOR

(75) Inventors: Shin-Hung Yeh, Taipei (TW); Jung-Chun Tseng, Pingtung (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 11/126,132

(22) Filed: May 10, 2005

(65) Prior Publication Data

US 2005/0270207 A1 Dec. 8, 2005

(30) Foreign Application Priority Data

May 21, 2004 (TW) ................................ 93114378 A

(51) Int. Cl.
*H03M 1/66* (2006.01)
*G09G 3/36* (2006.01)

(52) U.S. Cl. ........................................ 341/144; 345/98

(58) Field of Classification Search ................ 341/144; 345/87, 90, 92, 98, 99, 100, 82; 315/169.1, 315/169.3
See application file for complete search history.

(56) References Cited

U.S. PATENT DOCUMENTS

| | | | | |
|---|---|---|---|---|
| 5,712,652 | A * | 1/1998 | Sato et al. | 345/90 |
| 6,064,362 | A * | 5/2000 | Brownlow et al. | 345/98 |
| 6,373,459 | B1 * | 4/2002 | Jeong | 345/100 |
| 6,384,804 | B1 * | 5/2002 | Dodabalapur et al. | 345/82 |
| 6,445,323 | B1 * | 9/2002 | Cairns et al. | 341/144 |
| 6,498,596 | B1 * | 12/2002 | Nakamura et al. | 345/98 |
| 6,525,708 | B1 * | 2/2003 | Lin et al. | 345/92 |
| 6,617,796 | B1 * | 9/2003 | Sasaki et al. | 315/169.1 |
| 6,661,402 | B1 * | 12/2003 | Nitta et al. | 345/99 |
| 6,674,422 | B1 * | 1/2004 | Ozawa | 345/98 |
| 6,806,854 | B1 * | 10/2004 | Cairns et al. | 345/87 |
| 6,977,470 | B1 * | 12/2005 | Tseng | 315/169.3 |

* cited by examiner

*Primary Examiner*—Patrick Wamsley
(74) *Attorney, Agent, or Firm*—Thomas, Kayden, Horstemeyer & Risley

(57) ABSTRACT

A data driving circuit and method for an organic light emitting diode display. Data lines transmit first digital data in a first cycle, and subsequent digital data in a second cycle. A D/A converter electrically connected to the data lines converts the first digital data to first analog data, and converts the subsequent digital data to second analog data. Each analog sampling storage circuit electrically coupled to the D/A converter, in the first cycle, stores the first analog data, in the second cycle, outputs the first analog data and stores the second analog data, and in a third cycle, outputs the second analog data.

18 Claims, 6 Drawing Sheets

DATA DRIVING CIRCUIT, ORGANIC LIGHT EMITTING DIODE DISPLAY UTILIZING THE SAME, AND DRIVING METHOD THEREFOR

BACKGROUND

The present invention relates to a data driving circuit for an organic light emitting diode display, and more particularly, to a data driving circuit with a single D/A converter.

Digital data drivers for conventional organic light emitting displays normally use a storage register (digital latch), as a line buffer to store digital video signal in a signal cycle.

FIGS. 1A and 1B show a conventional 6-bit digital data driving scheme 10, in which binary bits of digital video data are loaded sequentially during a horizontal scan cycle. First, through data lines R[5]~B[0], binary bits of digital video data are written to corresponding first latches 11, all controlled by a sampling signal applied by a shift register SRn. Next, through data lines R[5]~B[0], subsequent digital video data of binary bits are written to corresponding first latches 21, all controlled by a sampling signal applied by a shift register SRn+1. Similarly, all the digital video data for a horizontal scan cycle is respectively stored into first latches. When the line buffer signal "LB" is asserted, all bits of digital video data stored in first latches 11 and 21 are written to the second latches 12, 22 and transmitted to the digital-to-analog converters DAC-Rn, DAC-Gn, DAC-Bn at the same time.

Data bit number increases with resolution, and the number of area-consuming storage registers and the number of digital-to-analog converters also increase. In the conventional layout of a digital driving circuit, when a data bit number increases with resolution, the number of storage registers and the number of the digital-to-analog converters also increase, and make layout more difficult due to limited horizontal layout area.

SUMMARY

It is an object of the present invention to provide a data driving circuit comprising data lines, a D/A converter and a plurality of analog sampling storage circuits. The data lines transmit first digital data in a first cycle, and subsequent digital data in a second cycle. The D/A converter electrically connected to the data lines converts the first digital data to first analog data, and the subsequent digital data to second analog data. Each analog sampling storage circuit electrically coupled to the D/A converter, in the first cycle, stores the first analog data, in the second cycle, outputs the first analog data and stores the second analog data, and in a third cycle, outputs the second analog data.

An organic light emitting diode display is also provided, comprising pixels, a scan driving circuit and a data driving circuit. The pixels are arranged in columns and rows. The scan driving circuit selects a row of pixels in sequence. The data driving circuit comprises data lines, a D/A converter and a plurality of analog sampling storage circuits. The data lines transmit first digital data in a first cycle, and subsequent digital data in a second cycle. The D/A converter electrically connected to the data lines converts the first digital data to first analog data, and converts the subsequent digital data to second analog data. Each analog sampling storage circuit electrically coupled to the D/A converter, in the first cycle, stores the first analog data, in the second cycle, outputs the first analog data and stores the second analog data, and in a third cycle, outputs the second analog data.

A driving method for an organic light emitting diode display is also provided. In a first cycle, first digital data is converted to first analog data, which is then stored. In a second cycle, subsequent digital data is converted to second analog data for storage and the first analog data is output to a pixel. The second analog data is output in a third cycle.

A detailed description is given in the following with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

Figure 1A:
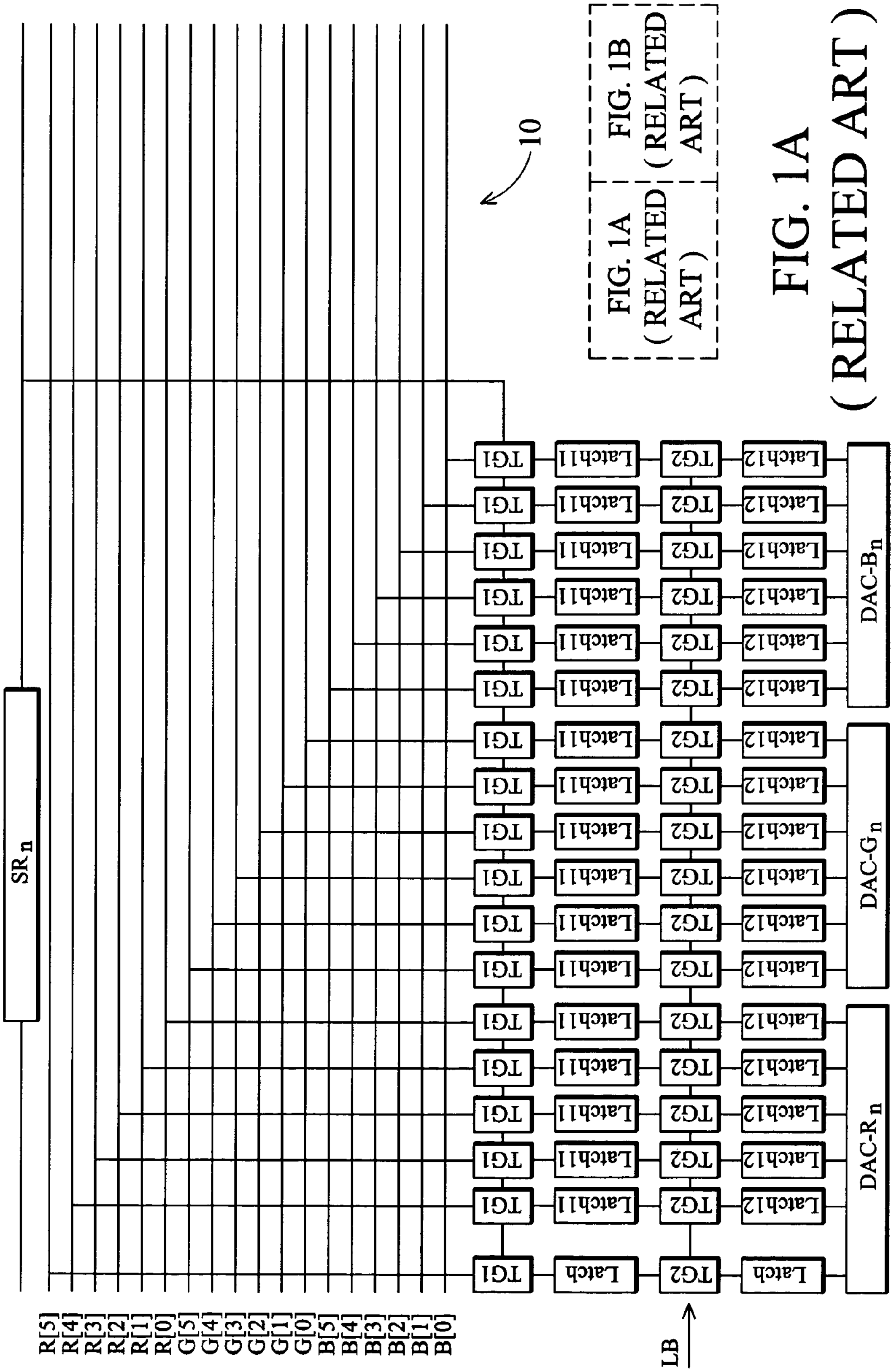
FIG. 1A (RELATED ART)
FIG. 1A and FIG. 1B show a conventional digital data driving circuit.
Figure 1B:
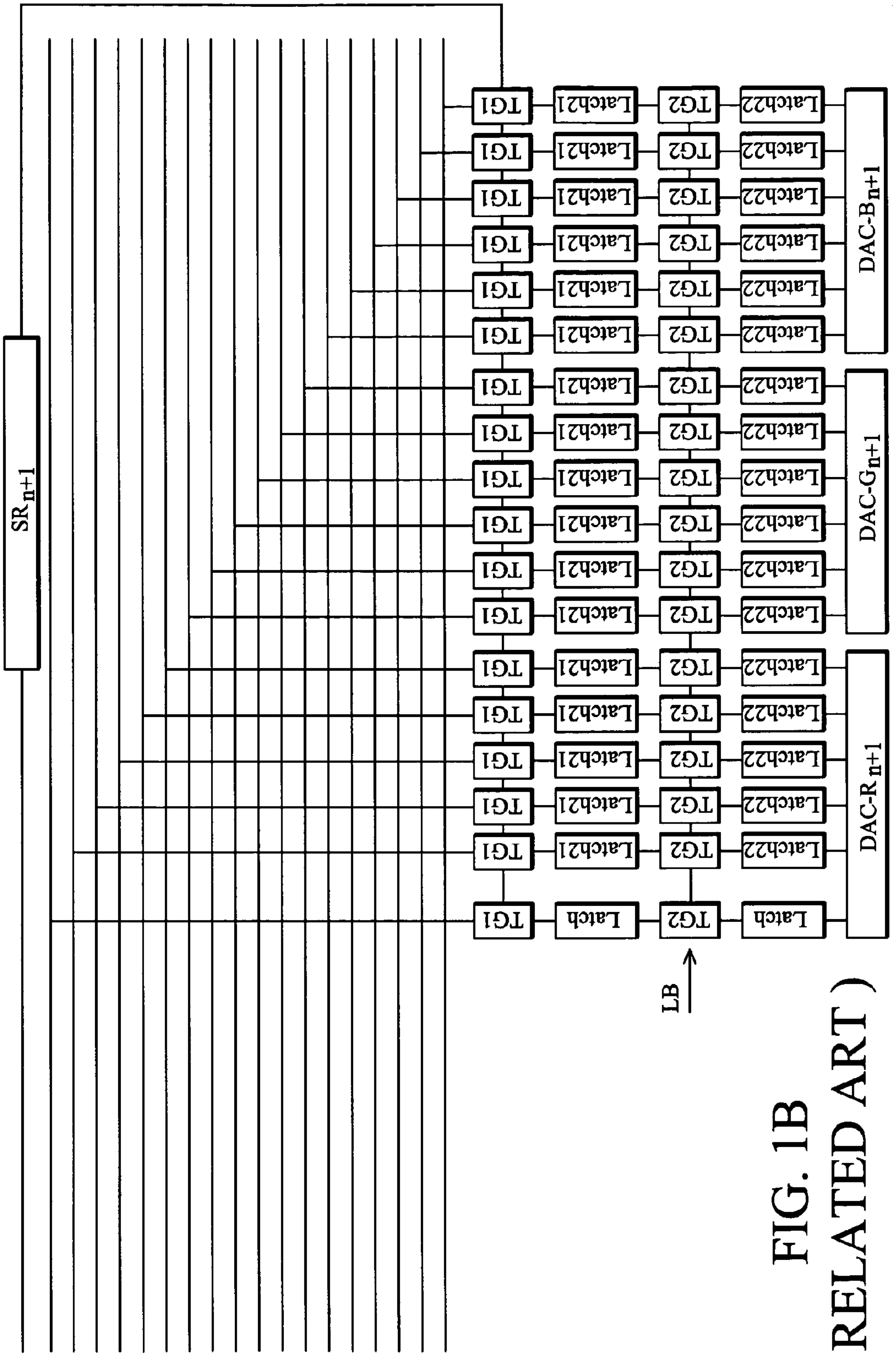
FIG. 1B (RELATED ART)
Figure 2:
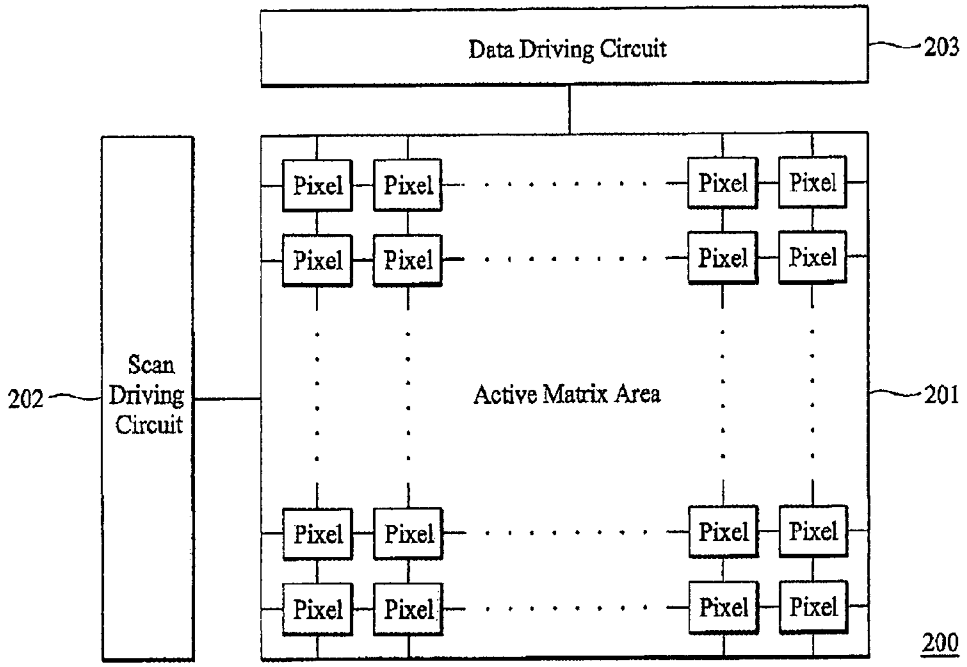
FIG. 2 illustrates an organic light emitting display.

FIG. 2 shows an organic light emitting diode display 200, comprising an active matrix array 201 with a plurality of pixels arranged in columns and rows, a scan driving circuit 202 sequentially selecting one row of pixels of the active matrix array 201, and a data driving circuit 203 outputting data to corresponding pixels.

Figure 3:
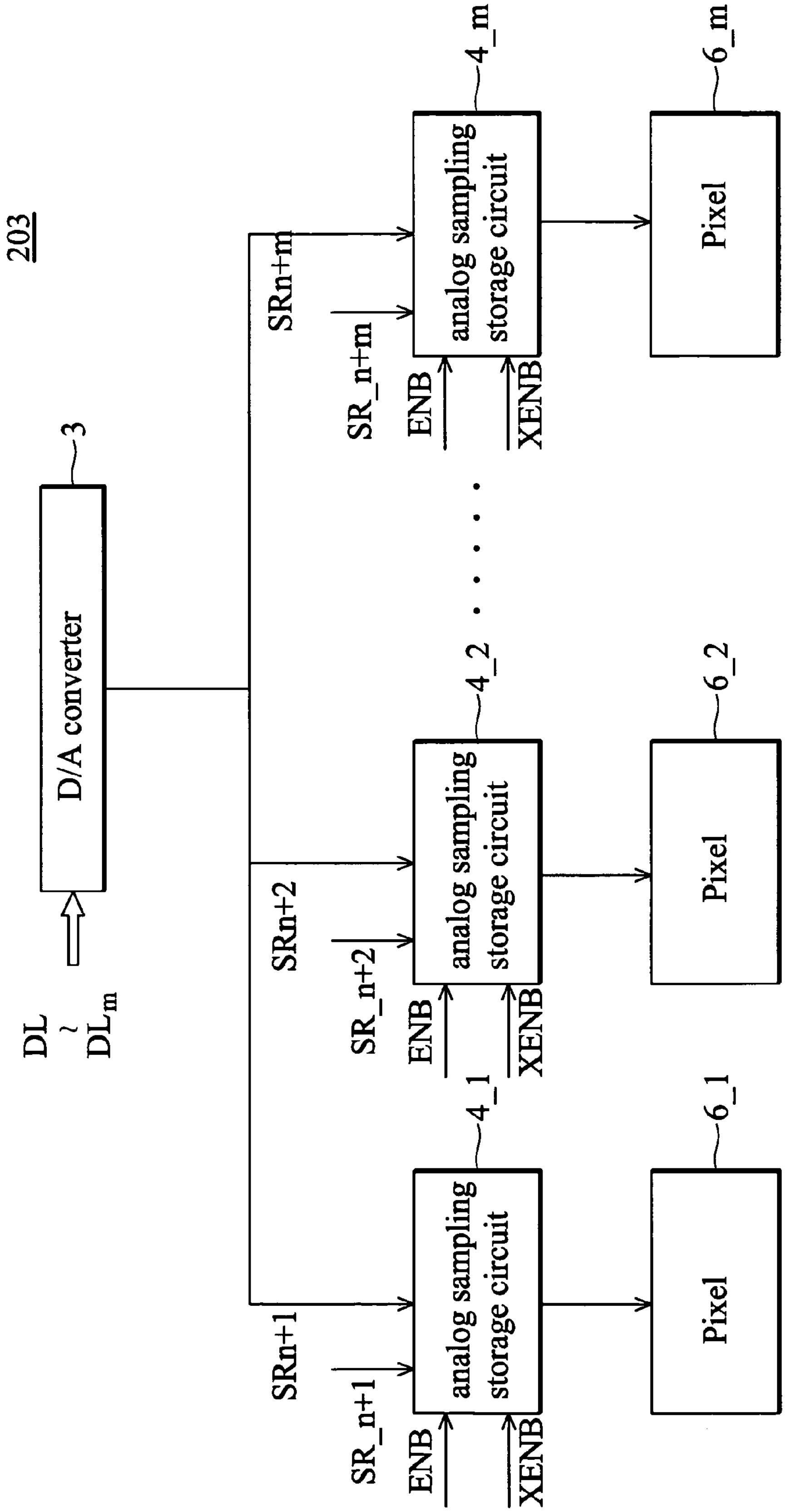
FIG. 3 is a block circuit diagram of a data driving circuit of an embodiment of the invention.

FIG. 3 is a block diagram of the data driving circuit 203 in FIG. 2, comprising a plurality of data driving lines DL1~DLm, a D/A converter 3, a plurality of analog sampling storage circuits 4_1~4_m, and a plurality of pixels 6_1~6_m.

The D/A converter 3 is coupled to the data lines DL1~DLm converting digital data to corresponding analog data. The analog sampling storage circuits 4_1~4_m are coupled to the D/A converter 3. Hereinafter, ENB is an enabling signal and XENB represents the reverted signal of ENB. One enabling sampling signal among SR_n+1~SR_n+m turns on one of the analog sampling storage circuits 4_1~4_m to sample the analog data transmitted from the D/A converter 3 and to drive a corresponding pixel with a stored signal sampled during the last horizontal scan cycle. There are two identical, parallel-operating storage schemes in one analog sampling storage circuit. One samples and the other performs a driving operation. For example, during a horizontal scan cycle A, in which ENB is asserted and XENB is therefore disserted, the first storage sampling storage circuit 4_1 samples incoming analog data I_DAC1 and at the same time drives a corresponding pixel with the stored signal sampled during the last horizontal scan cycle. During the next horizontal scan cycle B, in which ENB is disserted and XENB asserted, the first storage sampling storage circuit 4_1 samples incoming analog data I_DAC2 and at the same time drives the corresponding pixel with the stored signal sampled during the last horizontal scan cycle.

Figure 4:
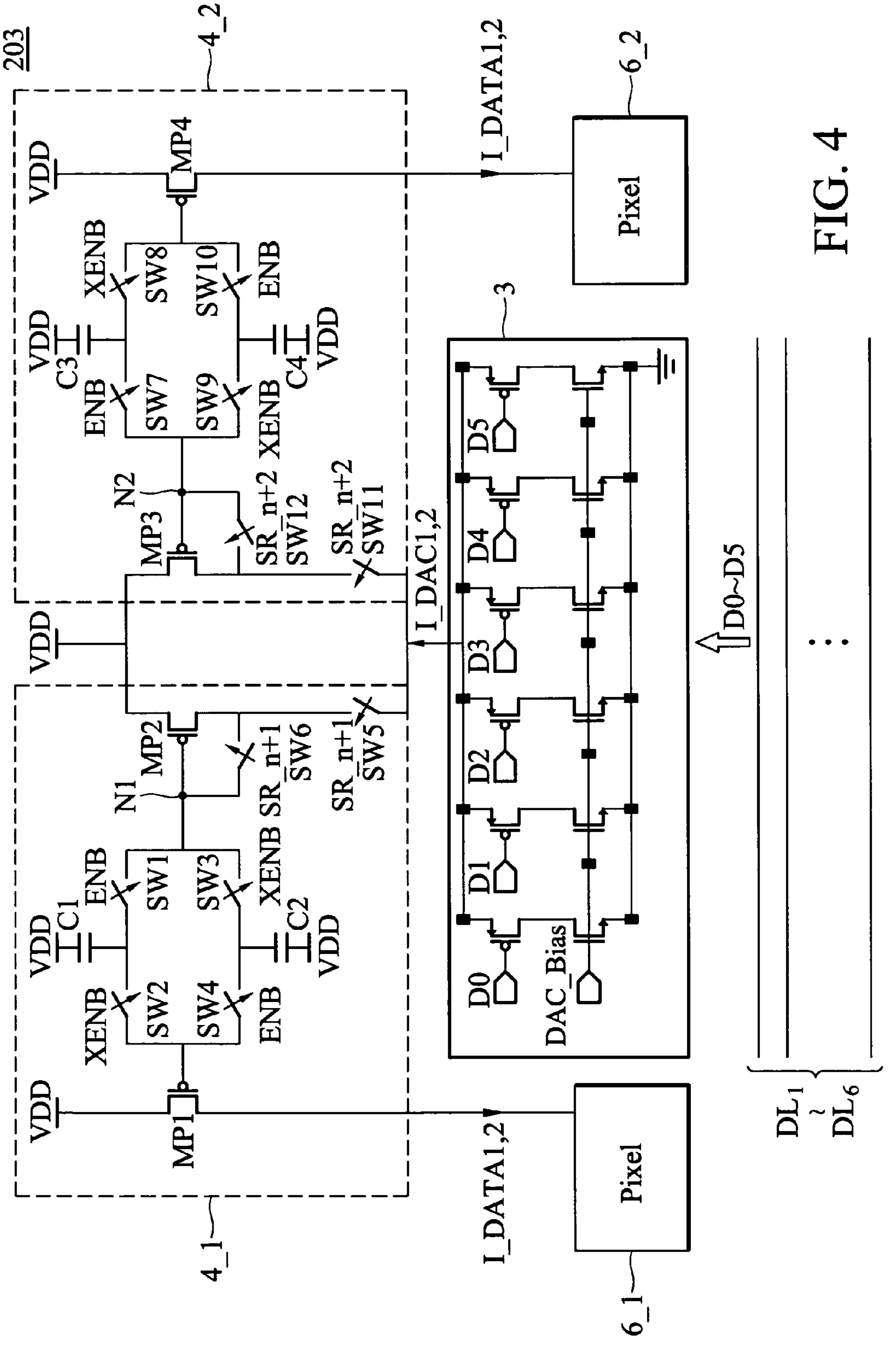
FIG. 4 shows a detailed circuit of a data driving circuit of an embodiment of the invention shown in FIG. 3.

FIG. 4 shows a detailed circuit of a data driving circuit of one embodiment of the invention shown in FIG. 3. In FIG. 4, 6-bit Data D0~D5 are transmitted to a 6-bit D/A converter 3 through signal lines DL1~DL6. The data driving circuit 203 comprises two analog sampling circuits 4_1 and 4_2.

The analog sampling storage circuit 4_1 comprises a transistor MP2 as a current recorder between a voltage source VDD and a D/A converter 3. A switch SW6 (the sixth switch) is between the gate of the transistor MP2 and the drain of the transistor MP2, and a switch SW5 (the fifth switch) is between the drain of the transistor MP2 and the D/A converter 3. When the sampling signal SR_n+1 is asserted, the switches SW5 and SW6 are turned on to create current from the D/A converter 3 through transistor MP2. The gate voltage of the transistor MP2 records and represents current therethrough and accordingly records the current through the D/A converter 3. Two storage capacitors C1 and C2 are coupled between a voltage source VDD and a first node in parallel, both sampling and storing the gate voltage of MP2. A switch SW1 (the first switch) is between the storage capacitor C1 and the first node N1. A switch SW3 (the third switch) is between the storage capacitor C2 and the first node N1. Controlled by either ENB or XENB, the switch SW1 is turned on while the switch SW3 is turned off, and vice versa. A transistor MP1 between the voltage source VDD and a pixel 6_1 has a gate coupled to the storage capacitor C1 through a switch SW2 (the second switch) and coupled to the storage capacitor C2 through a switch SW4 (the fourth switch). The voltage on either the storage capacitor C1 or the storage capacitor C2 causes the transistor MP1 to generate a corresponding current and drive a corresponding pixel. Controlled by either ENB or XENB, the switch SW2 is turned on while the switch SW4 is turned off, and vice versa. Note that SW1 and SW4 are turned on simultaneously by the same control signal, ENB, and SW2 and SW3 are turned on simultaneously by another control signal, XENB.

The analog sampling storage circuit 4_2 comprises transistors MP3 and MP4, two storage capacitors C3 and C4, and switches SW7–SW12, the same as analog sampling storage circuit 4_1. Thus, its description is omitted here.

Figure 5:
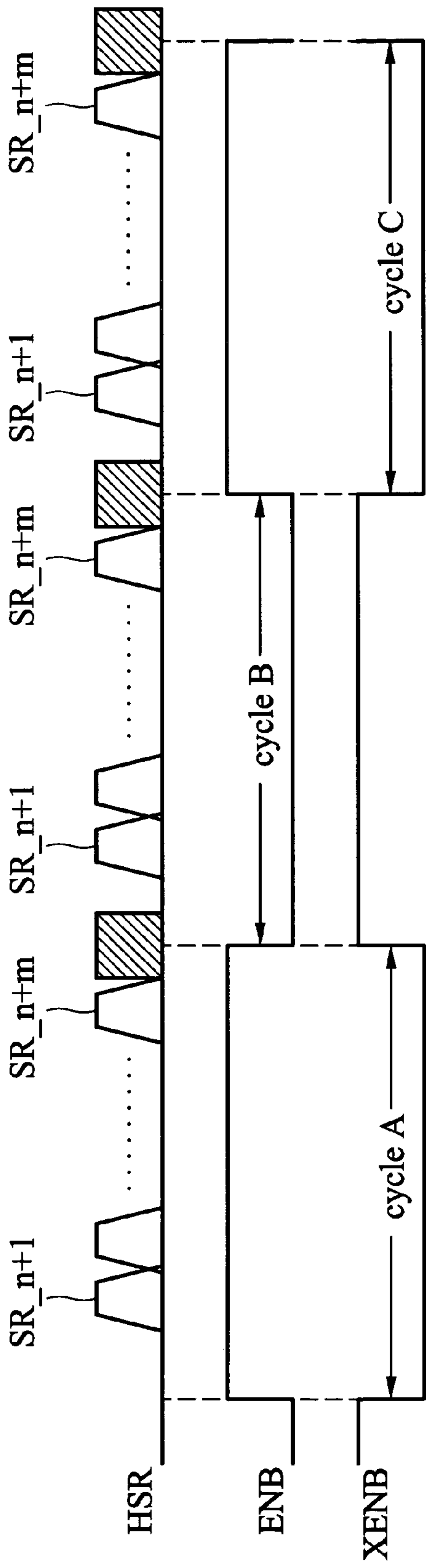
FIG. 5 is a timing diagram of the data driving circuit of an embodiment of the invention.

FIG. 5 illustrates a timing diagram of the data driving circuit 203. Only operation and timing of analog sampling storage circuit 4_1 are presented. First, in a cycle A (the first cycle), digital data D0~D5 (first digital data) are transmitted to the D/A converter 3 through corresponding the data lines DL1~DL6 to convert to corresponding analog data I_DAC1 (first analog data), such as current data as an example. Next, the sampling signal SR_n+1 is asserted to turn on the switches SW5 and SW6. The first signal ENB is asserted to-turn on the switches SW1 and SW4. The gate voltage of MP2, representing the analog data I_DAC1, is sampled and written to the storage capacitor C1 through switches SW5, SW6 and SW1.

In a cycle B (the second cycle), the first signal ENB is de-asserted, turning off switches SW1 and SW4, and the second signal XENB asserted, turning on switches SW2 and SW3. The sampled voltage on the storage capacitor C1, representing analog data I_DAC1, is sent to the gate of the transistor MP1 through turned-on SW2 to generate corresponding analog data I_DATA1 to a pixel 6_1. At the same time, bits of subsequent digital data, D0D5 (second digital data) are written into D/A converter 3 to convert to corresponding analog data I_DAC2 (second analog data). When the switches SW5 and SW6 are turned on according to the sampling signal SR_n+1, the analog data I_DAC2 (second analog data) is written to the storage capacitor C2 through turned-on SW3, and not to the storage capacitor C1 since SW1 is turned off.

In cycle C (the third cycle), the first signal ENB is asserted to turn on switches SW1 and SW4. The voltage on the storage capacitor C2, representing the analog data I_DAC2, is coupled to the gate of the transistor MP1 to generate corresponding analog data I_DATA2 to the pixel 6_1.

The operation of the analog storage circuit 4_2 is the same as analog storage circuit 4_1, with the difference that the switches SW11 and switch SW12 are turned on when sampling signal SR_n+2 is asserted in a corresponding cycle.

One of the switches may be a transistor or transmission gate.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. A data driving circuit, comprising:

a plurality of data lines for transmitting first digital data in a first cycle and transmitting subsequent digital data in a second cycle;

a D/A converter, electrically connected to the plurality of data lines, for converting the first digital data to first analog data and converting the subsequent digital data to second analog data; and a plurality of analog sampling storage circuits, coupled to the D/A converter, for respectively storing the first analog data in the first cycle, outputting the first analog data and storing the second analog data in the second cycle, and in a third cycle, outputting the second analog data.

2. The data driving circuit as claimed in claim 1, wherein each of the plurality of analog sampling storage circuits comprises:

a current recorder electrically coupled to a first node, the D/A converter and a voltage source;

a first storage capacitor electrically coupled to the voltage source and the first node;

a second storage capacitor electrically coupled to the voltage source and the first node;

a first transistor having an input end coupled to the voltage source, a control end coupled to the first storage capacitor and the second storage capacitor, and an output end;

a first switch coupled to the first storage capacitor and the first node;

a second switch coupled to the first storage capacitor and the control end of the first transistor;

a third switch coupled to the second storage capacitor and the first node; and a fourth switch coupled to the second storage capacitor and the control end of the first transistor.

3. The data driving circuit as claimed in claim 2, wherein the current recorder comprises:

a second transistor having an input end connected to the voltage source, a control end connected to the first node, and a output end coupled to the D/A converter;

a fifth switch coupled to the output end of the second transistor and the D/A converter; and a sixth switch coupled to the first node and the output end of the second transistor.

4. The data driving circuit as claimed in claim 3, wherein one of the first to sixth switches is a transistor or a transmission gate.

5. An organic light emitting diode display, comprising:

a plurality of pixels arranged in columns and rows;

a scan driving circuit for scanning a row of pixels in sequence; and a data driving circuit comprising:

a plurality of data lines for transmitting first digital data in a first cycle and transmitting subsequent digital data in a second cycle;

a D/A converter, electrically connected to the plurality of data lines, for converting the first digital data to first analog data and converting the subsequent digital data to second analog data; and a plurality of analog sampling storage circuits, coupled to the D/A converter, for respectively storing the first analog data in the first cycle, outputting the first analog data to a corresponding pixel and storing the second analog data in the second cycle, and outputting the second analog data to the corresponding pixel in a third cycle.

6. The organic light emitting diode display as claimed in claim 5, wherein each of the plurality of analog sampling storage circuits comprises:

a current recorder electrically coupled to a first node, the D/A converter and a voltage source;

a first storage capacitor electrically coupled to the voltage source and the first node;

a second storage capacitor electrically coupled to the voltage source and the first node;

a first transistor having an input end coupled to the voltage source, a control end coupled to the first storage capacitor and the second storage capacitor, and an output end;

a first switch coupled to the first storage capacitor and the first node;

a second switch coupled to the first storage capacitor and the control end of the first transistor;

a third switch coupled to the second storage capacitor and the first node; and a fourth switch coupled to the second storage capacitor and the control end of the first transistor.

7. The organic light emitting diode display as claimed in claim 6, wherein the current recorder comprises:

a second transistor having an input end connected to the voltage source, a control end connected to the first node, and an output end coupled to the D/A converter;

a fifth switch coupled to the output end of the second transistor and the D/A converter; and a sixth switch coupled to the first node and the output end of the second transistor.

8. The organic light emitting diode display as claimed in claim 7, wherein one of the first to sixth switches is a transistor or a transmission gate.

9. A method for driving an organic light emitting diode display, the organic light emitting diode display comprising a plurality of pixels and a data driving circuit which comprises a plurality of data lines, a D/A converter electrically connected to the data lines, and a plurality of analog sampling storage circuits electrically coupled to the D/A converter, the method comprising the steps of:

converting first digital data to first analog data through the D/A converter in a first cycle;

converting subsequent digital data to second analog data through the D/A converter in a second cycle;

storing the first analog data in the first cycle for each analog sampling storage circuit;

outputting the first analog data to a corresponding pixel in the second cycle for each analog sampling storage circuit;

storing the second analog data in the second cycle for each analog sampling storage circuit; and outputting the second analog data to the corresponding pixel in a third cycle for each analog sampling storage circuit.

10. The method as claimed in claim 9, wherein the step of storing the first analog data comprises:

providing a first signal to turn on a first switch in the first cycle; and storing the first analog data to a first storage capacitor in the first cycle.

11. The driving method as claimed in claim 10, wherein the step of outputting the first analog data comprises:

providing the first signal to turn off the first switch in the second cycle;

providing a second signal to turn on a second switch in the second cycle; and outputting the first analog data from the first storage capacitor to the corresponding pixel through a first transistor in the second cycle.

12. The driving method as claimed in claim 11, wherein the step of storing the second analog data comprises:

providing the second signal to turn on a third switch in the second cycle; and storing the second analog data to a second storage capacitor in the second cycle.

13. The driving method as claimed in claim 12, wherein the step of outputting the second analog data comprises:

providing the second signal to turn off the third switch in the third cycle;

providing the first signal to turn on a fourth switch in the third cycle; and outputting the second analog data from the second storage capacitor to the corresponding pixel through the first transistor in the third cycle.

14. The method as claimed in claim 9, wherein the step of outputting the first analog data comprises:

providing a first signal to turn off a first switch in the second cycle;

providing a second signal to turn on a second switch in the second cycle; and outputting the first analog data from a first storage capacitor to the corresponding pixel through a transistor in the second cycle.

15. The method as claimed in claim 9, wherein the step of storing the second analog data comprises:

providing a first signal to turn on a first switch in the second cycle; and storing the second analog data to a first storage capacitor in the second cycle.

16. The method as claimed in claim 9, wherein the step of outputting the second analog data comprises:

providing a first signal to turn off a first switch in the third cycle;

providing a second signal to turn on a second switch in the third cycle; and outputting the second analog data from a first storage capacitor to the corresponding pixel through a transistor in the third cycle.

17. The method as claimed in claim 9, wherein the step of storing the first analog data comprises providing a sampling signal to turn on a first switch and a second switch for transmitting the first analog data to a transistor.

18. The method as claimed in claim 9, wherein the step of storing the second analog data comprises providing a sampling signal to turn on a first switch and a second switch for transmitting the second analog data to a transistor.

* * * * *